United States Patent
Lee et al.

(10) Patent No.: US 11,545,457 B2
(45) Date of Patent: Jan. 3, 2023

(54) SEMICONDUCTOR PACKAGE, REDISTRIBUTION STRUCTURE AND METHOD FOR FORMING THE SAME

(71) Applicant: Taiwan Semiconductor Manufacturing Company, Ltd., Hsinchu (TW)

(72) Inventors: Chiang-Hao Lee, Changhua County (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 164 days.

(21) Appl. No.: 17/006,872

(22) Filed: Aug. 30, 2020

(65) Prior Publication Data
US 2022/0068869 A1 Mar. 3, 2022

(51) Int. Cl.
| | |
|---|---|
| *H01L 25/18* | (2006.01) |
| *H01L 23/00* | (2006.01) |
| *C25D 7/12* | (2006.01) |
| *C25D 21/06* | (2006.01) |
| *C25D 3/38* | (2006.01) |
| *C25D 5/02* | (2006.01) |
| *C25D 21/18* | (2006.01) |

(52) U.S. Cl.
CPC .............. *H01L 24/24* (2013.01); *C25D 3/38* (2013.01); *C25D 5/02* (2013.01); *C25D 7/12* (2013.01); *C25D 21/06* (2013.01); *C25D 21/18* (2013.01); *H01L 24/25* (2013.01); *H01L 24/82* (2013.01); *H01L 25/18* (2013.01); *H01L 2224/245* (2013.01); *H01L 2224/24101* (2013.01); *H01L 2224/24155* (2013.01); *H01L 2224/25171* (2013.01); *H01L 2224/82101* (2013.01); *H01L 2224/82106* (2013.01)

(58) Field of Classification Search
CPC ......... H01L 24/24–25; H01L 2224/245; H01L 2224/25171
See application file for complete search history.

(56) References Cited

U.S. PATENT DOCUMENTS

| | | | |
|---|---|---|---|
| 10,163,832 B1 * | 12/2018 | Huang | H01L 24/20 |
| 11,251,153 B2 * | 2/2022 | Chiba | H01L 24/45 |

* cited by examiner

*Primary Examiner* — Tucker J Wright
(74) *Attorney, Agent, or Firm* — JCIPRNET

(57) ABSTRACT

A semiconductor package, a redistribution structure and a method for forming the same are provided. The redistribution structure for coupling an encapsulated die is provided, the redistribution structure includes a conductive pattern disposed over and electrically coupled to the encapsulated die. The conductive pattern extends beyond an edge of the encapsulated die along a first extending direction which intersects a second extending direction of the edge of the encapsulated die by an angle in a top view, and an impurity concentration of sulfur in the conductive pattern is less than about 0.1 ppm.

14 Claims, 7 Drawing Sheets

SEMICONDUCTOR PACKAGE, REDISTRIBUTION STRUCTURE AND METHOD FOR FORMING THE SAME

BACKGROUND

Currently, integrated fan-out (InFO) packages are becoming increasingly popular for their compactness. In the InFO packages, formation of redistribution layers (RDLs) plays an important role during packaging process. For example, the RDLs can provide redistributed access to I/O connectors of semiconductor dies. The RDLs may be formed by plating copper on a copper seed layer. Although existing electroplating processes have been generally adequate for their intended purposes, they have not been entirely satisfactory in all respects. For example, defects such as voids are found in the RDLs. Such defects can seriously degrade mechanical and electrical reliability of the RDLs. Accordingly, there exists a need for electroplating process that overcomes these shortcomings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
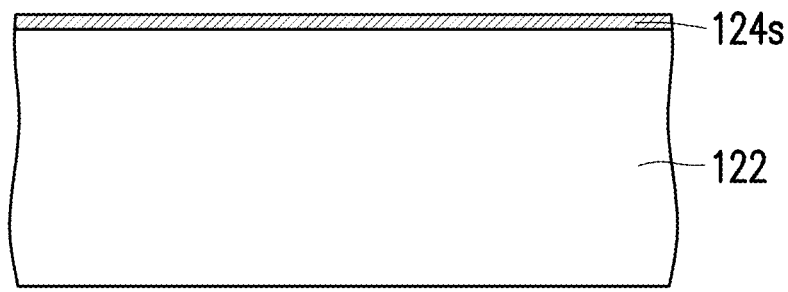
FIGS. 1A-1E are schematic cross-sectional views of various stages of forming a redistribution layer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
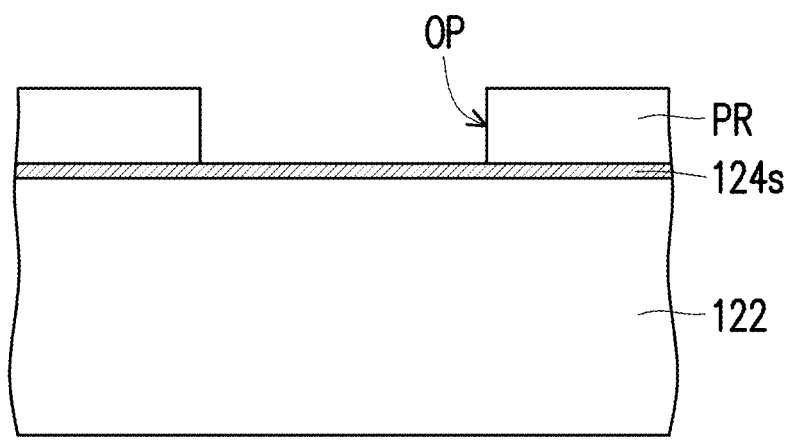
Figure 1C:
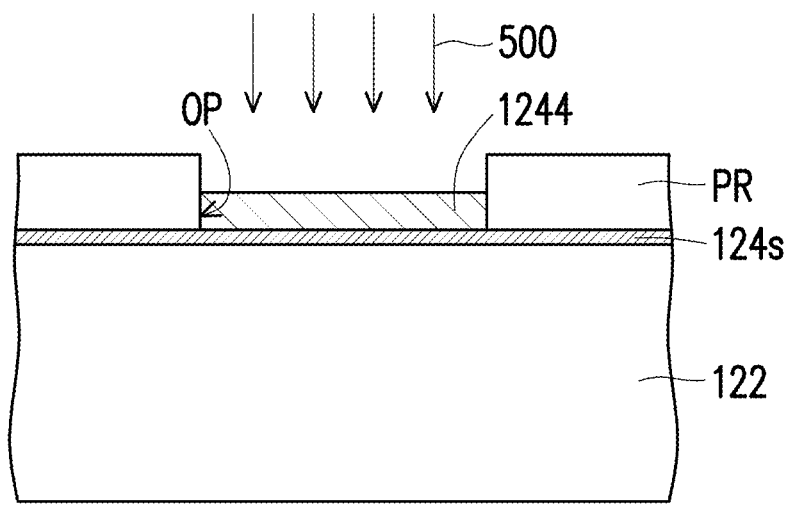
Figure 1D:
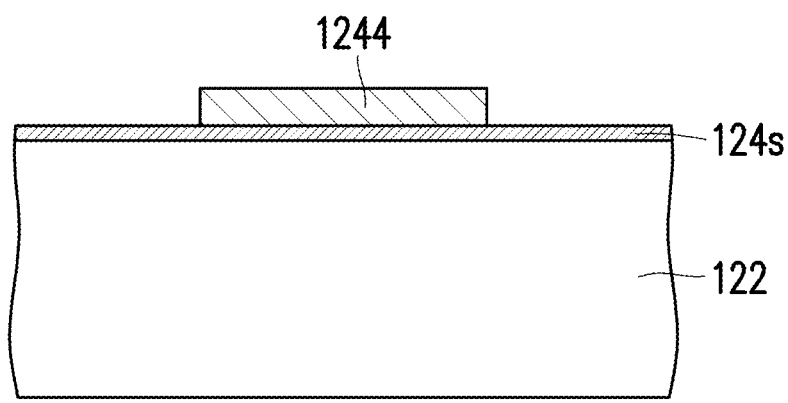
Figure 1E:
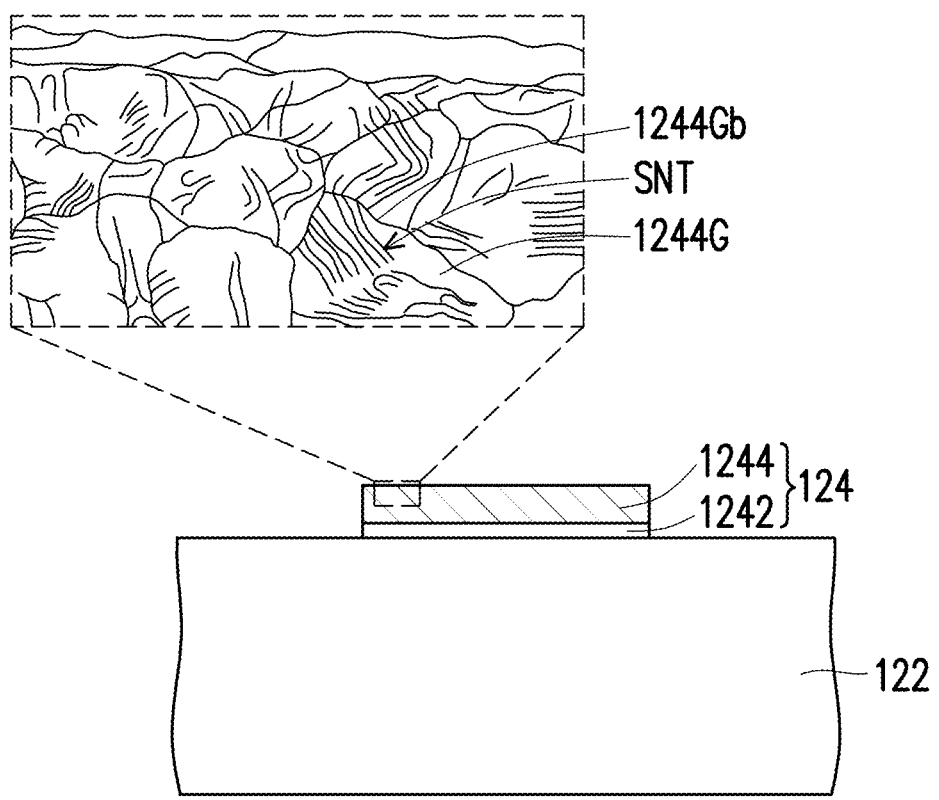
Figure 2:
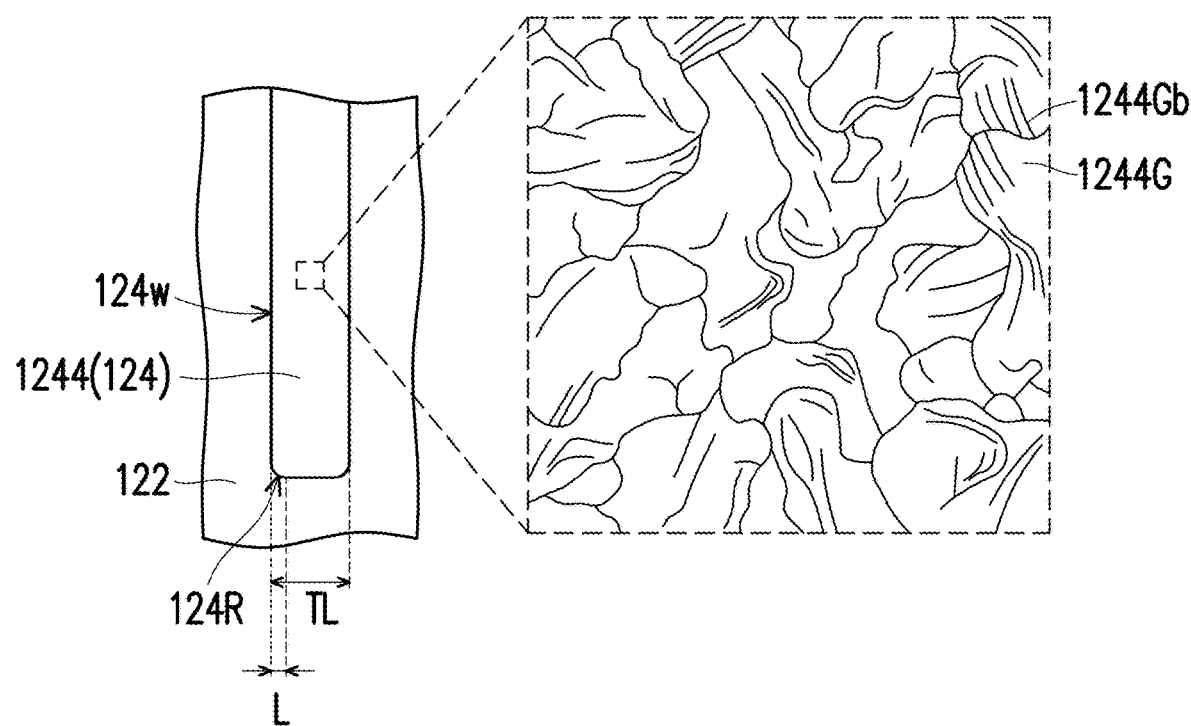
FIG. 2 is a schematic top view of FIG. 1E in accordance with some embodiments.

FIGS. 1A-1E are schematic cross-sectional views of various stages of forming a redistribution layer in accordance with some embodiments and FIG. 2 is a schematic top view of FIG. 1E in accordance with some embodiments.

Referring to FIG. 1A, a seed material 124s is formed on a base layer 122. In some embodiments, the base layer 122 includes a polymer material such as polybenzoxazole (PBO), polyimide (PI), benzocyclobutene (BCB), Ajinomoto build-up film (ABF), or other suitable polymer materials. In some embodiments, the base layer 122 includes silicon based materials, such as glass, silicon oxide, silicon carbide, silicon nitride, combinations of any of these materials, or the like. In some embodiments, the base layer 122 is a substrate which may be part of a semiconductor package, such as an integrated circuit (IC). In some embodiments, the base layer 122 includes a barrier layer overlying a semiconductor substrate, and the seed material 124s is formed on the barrier layer. The seed material 124s may be a thin film of a conductive material that aids in the formation of a thicker metallic layer during subsequent processing steps. For example, the seed material 124s includes a titanium/copper bilayer, a copper layer, or other suitable metal layer. The seed material 124s may be deposited on the base layer 122 using suitable process such as sputtering, evaporation, chemical vapor deposition (CVD), or plasma-enhanced CVD (PECVD) processes, depending upon the desired materials.

Referring to FIG. 1B, a photoresist layer PR having an opening OP is formed on the seed material 124s. For example, the photoresist material is deposited on the seed material 124s by any suitable technique, such as spin coating, and then patterned according to a desired layout of redistribution pattern. In some embodiments, the photoresist material is patterned by lithography and etching process to form the photoresist layer PR with the opening OP accessibly revealing a desired portion of the seed material 124s. For example, the photoresist material is exposed to a patterned light source, thereby inducing a physical change in those portions of the photoresist material exposed to the patterned light source, and then a developer applied to the photoresist material to selectively remove either the exposed portion of the photoresist material or the unexposed portion of the photoresist material, depending upon the characteristic of the photoresist material and the desired pattern.

Referring to FIG. 1C, a plated conductive layer 1244 is formed on the seed material 124s within the opening OP of the photoresist layer PR. For example, the plated conductive layer 1244 includes one or more conductive materials, such as copper, tungsten, other metals, metal alloy, or the like. The plated conductive layer 1244 may be formed by electroplating, electroless plating, or other suitable deposition process. In some embodiments in which an electroplating process (or electrochemical plating (ECP) process) 500 is used, the seed material 124s and the photoresist layer PR are submerged or immersed in an electroplating solution (also referred to a plating bath), where the seed material 124s may function as the cathode in the electroplating process. A conductive anode disposed in the electroplating solution is attached to the positive side of the power supply, and the atoms from the conductive anode are dissolved into the electroplating solution, thereby plating the exposed conductive areas of the seed material 124s within the opening OP of the photoresist layer PR. The details of the plating process will be described later in accompanying with FIG. 3.

Referring to FIGS. 1D-1E, the photoresist layer PR is removed and a portion of the seed material 124s that is not covered by the plated conductive layer 1244 may be removed to form a seed layer 1242. For example, the photoresist layer PR is stripped by etching, ashing, or other suitable removal processes. The portion of the seed material 124s that were covered by the photoresist layer PR is then removed to form the seed layer 1242. For example, by using the plated conductive layer 1244 as a mask, the portion of the seed material 124s is removed through etching until the base layer 122 is revealed. Up to here, forming a conductive pattern 124 including the plated conductive layer 1244 and the underlying seed layer 1242 on the base layer 122 is substantially completed. The conductive pattern 124 may be referred to as a redistribution layer (RDL) in accordance with some embodiments. The metal lines of the conductive pattern 124 may have a certain width and a certain amount of spacing between them. By way of example, and not by limitation, the dimension of line width/spacing of the conductive pattern 124 is about 2 µm/2 µm. Other dimension of the conductive pattern 124 may be used.

Continue to FIG. 1E and also with reference to FIG. 2, the dashed area in FIG. 1E shows a schematic and enlarged cross-sectional view of the plated conductive layer 1244 of the conductive pattern 124, and the dashed area in FIG. 2 shows a schematic and enlarged top view of the plated conductive layer 1244 of the conductive pattern 124. For example, one feature displayed in the plated conductive layer 1244 is a metallic grain structure. In some embodiments in which the plated conductive layer 1244 is formed by copper plating, the plated conductive layer 1244 includes a plurality of copper crystal grains 1244G adjacent to one another. Large grains 1244G may be seen in the cross-section of the plated conductive layer 1244. For example, the average grain size of the copper crystal grains 1244G is larger than 0.5 µm. In some embodiments, the average grain size of the copper crystal grains 1244G ranges from about 0.5 µm to about 1.5 µm. In some embodiments, the average grain size of the copper crystal grains 1244G ranges from about 0.5 µm to about 1.0 µm. Alternatively, the average grain size of the copper crystal grains 1244G ranges from about 1.0 µm to about 1.5 µm. In some embodiments, the plated conductive layer 1244 formed by the copper plating process described in FIG. 3 has a surface roughness ranging from about 100 nm to about 180 nm. It is appreciated that the average grain size and the surface roughness of the plated conductive layer 1244 depend on the details of the plating process and may be less than or greater than the aforementioned ranges.

Still referring to FIG. 1E, a plurality of sub-nano-twinning microstructures SNT may be found in the copper crystal grains 1244G. For example, the striations substantially parallel to one another shown in FIG. 1E are referred to as the sub-nano-twinning microstructures SNT in the disclosure. In some embodiments, the sub-nano-twinning microstructures SNT are found at the grain boundary 1244 Gb (i.e. the interface between two adjacent grains 1244G). The orientation of the sub-nano-twinning microstructures SNT in the neighboring grains 1244G may be different or irregular. The sub-nano-twinning microstructures SNT may inhibit the formation of voids in the plated conductive layer 1244. In some embodiments, by using the plating process described in FIG. 3, the plated conductive layer 1244 is substantially void-free at the grain boundary 1244 Gb. Accordingly, the circuit performance of the redistribution layer may be increased.

Continue to FIG. 2, the conductive pattern 124 has corners 124R in the top view. The sidewalls 124w connected to the corners 124R of the conductive pattern 124 may be substantially straight. In some embodiments, during the etching process of removing the portion of the seed material that is not covered by the plated conductive layer 1244, the plated conductive layer 1244 may be affected. For example, the plated conductive layer 1244 is slightly etched the corners 124R, so that the corners 124R may have a certain degree of roundness. In some embodiments, since the plated conductive layer 1244 having the larger copper grain size is obtained, the effect of rounding the corners may be reduced. For example, the conductive pattern 124 has relatively sharp corners 124R having smaller radius with higher curvature. In comparison, the corners of the plated copper layer having finer grains (not shown) may have larger radius with lower curvature. In some embodiments, the radius of the corner 124R ranges from about 0.3 µm to about 1 µm. The roundness of the corners 124R may be measured by comparing the length L of the corner 124R and the maximum length TL of a side of the conductive pattern 124 in the top view. For example, a ratio of the length L of the corner 124R to the maximum length TL is about 0.01 to about 0.1. It is noted that the amount of curvature may be adjusted by varying the process parameters.

Figure 3:
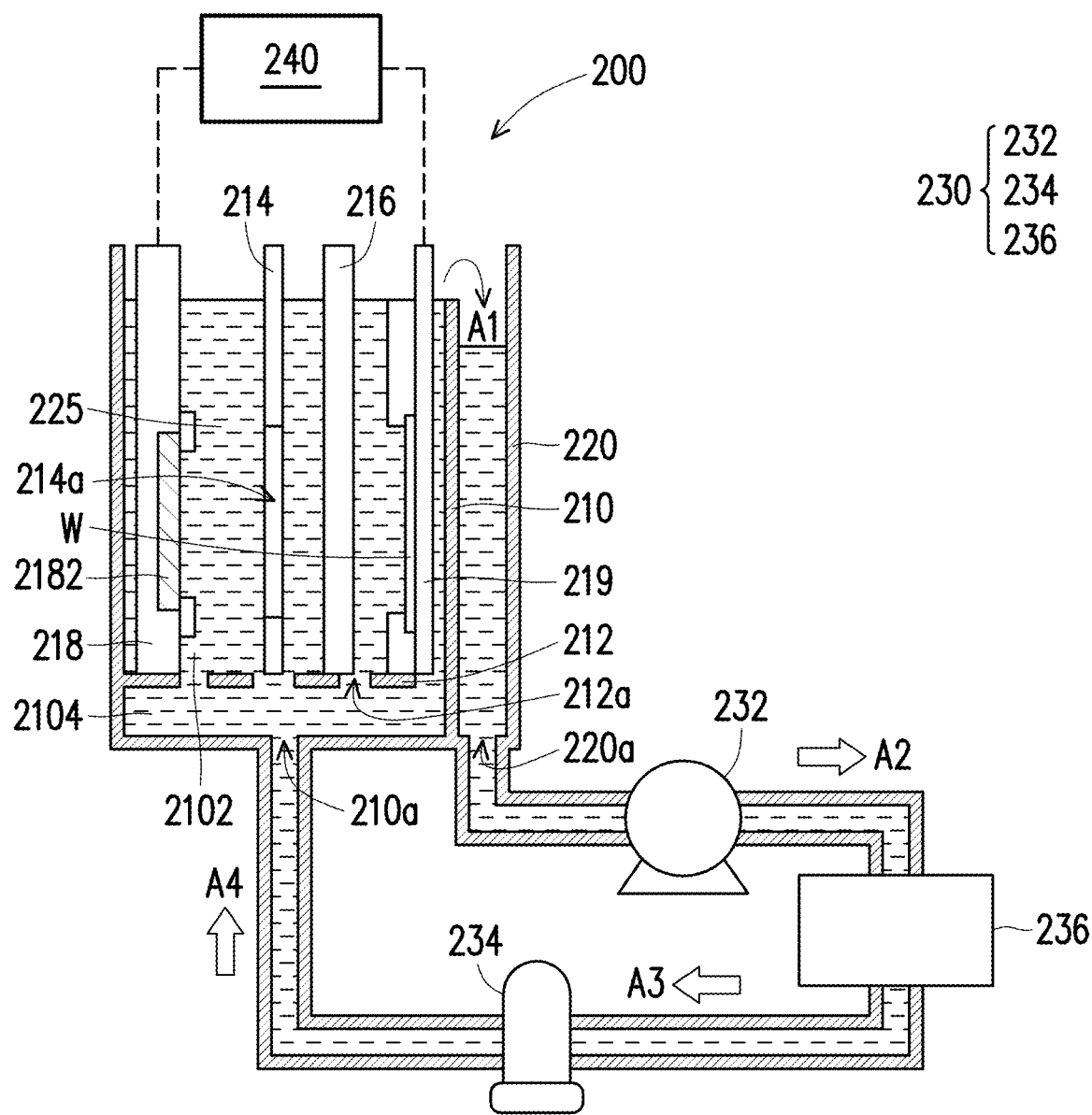
FIG. 3 is a schematic cross-sectional view of electroplating apparatus for performing an electroplating process in accordance with some embodiments.

FIG. 3 is a schematic cross-sectional view of electroplating apparatus for performing an electroplating process in accordance with some embodiments. Referring to FIG. 3, an electroplating apparatus 200 includes a plating tank 210 configured to containing a plating bath (e.g., a plating solution 225) and an overflow tank 220 connected to the plating tank 210 for receiving the plating solution 225 that has overflowed an edge of the plating tank 210. In some embodiments, a separation plate 212 is disposed in the plating tank 210 to partition the interior of the plating tank 210 into a processing chamber 2102 and a distribution chamber 2104, where the distribution chamber 2104 is located in proximity to an inlet 210a of the plating tank 210. In some embodiments, the separation plate 212 is disposed horizontally to divide the plating tank 210 into an upper portion (e.g., processing chamber 2102) and a lower portion (e.g., the distribution chamber 2104). Although other orientation of the separation plate 212 may be used. For example, a plurality of passage holes 212a is provided in the separation plate 212 for passage of the plating solution 225. In some embodiments, the plating solution 225 flows from the inlet 210a to the distribution chamber 2104 and passes through the passage holes 212a of the separation plate 212 to fill the processing chamber 2102. For example, the passage holes 212a are distributed in the separation plate 212 in a manner to allow the plating solution 225 passing through the passage holes 212a to form a uniform flow toward the processing chamber 2102.

In some embodiments, an anode 2182 carried by a anode holder 218 and a work-piece holder 219 carrying a work piece W may be disposed in the plating tank 210 and immersed in the plating solution 225 contained in the processing chamber 2102. For example, the anode holder 218 and the work-piece holder 219 are disposed in a vertical manner in the processing chamber 2102. Alternatively, the anode holder 218 and the work-piece holder 219 are horizontally disposed in the plating tank 210. In some embodiments, the electroplating apparatus 200 includes a regulation plate 214 and a paddle 216 disposed inside the processing chamber 2102 of the plating tank 210. For example, the regulation plate 214 and the paddle 216 are arranged between the anode holder 218 and the work-piece holder 219. In some embodiments, the anode holder 218 and the work-piece holder 219 are disposed along two opposing sidewalls of the plating tank 210, and the regulation plate 214 and the paddle 216 are disposed parallel to the work piece W held by the work-piece holder 219. The regulation plate 214 may be located in proximity to the anode 2182 held by the anode holder 218, and the paddle 216 may be located between the regulation plate 214 and the work-piece holder 219.

In some embodiments, at least one through hole 214a is provided in the regulation plate 214 and configured to adjust the electric field distribution of the work piece W in the plating tank 210. It is noted that although one through hole is illustrated in FIG. 3, a plurality of the through holes may be distributed in the regulation plate 214 depending on process requirements. In some embodiments, the paddle 216 is configured to be moving in the plating tank 210 to stir the plating solution 225 into a uniform mass. It is also noted that although a single paddle is illustrated in FIG. 3, a plurality of the paddles may be disposed in the plating tank 210 to thoroughly mix the plating solution 225. In some embodiments, the electroplating apparatus 200 includes a power supply 240 electrically coupled to the anode 2182 and the work-piece holder 219 carrying the work piece W to be processed. For example, the anode 2182 includes a source of a metal (e.g., copper) that is to be plated onto the work piece W.

Continue to FIG. 3, the electroplating apparatus 200 may include a supply unit 230 in communication with the plating tank 210 and the overflow tank 220. For example, the supply unit 230 includes a pump 232 in communication with the outlet 220a of the overflow tank 220 and configured to convey the plating solution 225 discharging from the overflow tank 220 toward the inlet 210a of the plating tank 210 through pipeline. In some embodiments, the supply unit 230 includes a carbon filter 234 disposed downstream of the pump 232 and configured to remove contaminant in the return flow of the plating solution 225 before entering the inlet 210a of the plating tank 210. For example, the pump 232 continuously pumps the plating solution 225 through the carbon filter 234 to provide the circulation. The pump 232 may be referred to as a circulating pump. In some embodiments, the plating solution 225 overflows from the edge of the plating tank 210 to the overflow tank 220 as indicated by arrows A1, and then the plating solution 225 discharged from the outlet 220a of the overflow tank 220 is pumped and filtered before returned to the plating tank 210 as indicated by arrows A2-A4, thereby completing recirculation.

The supply unit 230 may include a temperature controller 290 for controlling the temperature of the plating solution 225. For example, the temperature controller 290 includes thermostatic controller, heater, cooler, temperature sensor, combination of these, etc. It is noted that during the electroplating, quality of the plated conductive layer may be affected by the temperature of the electrolyte. In some embodiments, the temperature of the return flow of the plating solution 225 is regulated via the temperature controller 290 to meet the plating conditions. In some embodiments, the temperature controller 290 is disposed downstream of the pump 232. For example, the temperature controller 290 is arranged between the pump 232 and the carbon filter 234 to regulate the temperature of the plating solution 225 before flowing through the carbon filter 234. In some embodiments, the temperature controller 290 is disposed downstream of the carbon filter 234 to control the temperature of the plating solution 225 before filling the plating tank 210. Alternatively, the temperature controller 290 is disposed between the outlet 220a of the overflow tank 220 and the pump 232. It is noted that although a single pump, a single filter and a single temperature controller are illustrated in FIG. 3, the numbers of the pump, filter, and temperature controller construe no limitation in the disclosure. The electroplating apparatus 200 may include additional elements which are not shown for the purpose of simplicity and clarity.

Still referring to FIG. 3 and also with reference to FIGS. 1B-1C, for example, during an electrochemical plating cycle, the work piece W (such as the structure shown in FIG. 1B) is mounted onto the work-piece holder 219, and then placed in the processing chamber 2102 of the plating tank 210 to be immersed in the plating solution 225. The power supply 240 (e.g., a DC power supply) may be electrically coupled to a control system (not shown) and may provide a negative output to the work piece W and a positive output to the anode 2182 to perform a plating process (e.g., the electroplating process 500 shown in FIG. 1C). For example, an electrochemical reaction (e.g., $Cu^{2+}+2e^-\rightarrow Cu$) on the work piece W may result in deposition of the conductive layer (e.g., copper layer) thereon, and the oxidation reaction (e.g., $Cu\rightarrow Cu^{2+}+2e^-$) may take place at the anode 2182 to replenish the ion concentration of the plating solution 225. It is noted that embodiments of the disclosure may be applied to other suitable electrochemical reaction and the deposition of other conductive materials.

The plating solution 225 may be initially prepared and provided in the plating tank 210 for the electrochemical plating. For example, the plating solution 225 includes a metal salt containing ions of the metal to be electroplated on the work piece W. In some embodiments in which the copper layer is to be plated, the plating solution 225 includes a mixture of copper salt, acid, and water. For example, copper salts used in the plating solution 225 include copper sulfate, copper fluoride, copper cyanide, copper nitrate, copper oxide, copper fluoroborate, copper pyrophosphate, or the like. The acids used in the plating solution 225 may include sulfuric acid, fluoroboric acid, nitric acid, and phosphoric acid, or the like. However, embodiments of the disclosure are not limited thereto. The concentration of the copper salt and the concentration of acid used in the plating solution 225 may vary depending on the particular copper salt and acid used.

In some embodiments, the plating solution 225 is a liquid solution consisting of copper sulfate ($CuSO_4$) for the main electrolyte, electrically conductive agent (e.g., sulfuric acid ($H_2SO_4$)), anode dissolution agent (e.g., hydrochloric acid (HCl)), and water ($H_2O$) used as a solvent. For example, the concentration of $CuSO_4$ is about 160 g/L to about 240 g/L, the concentration of $H_2SO_4$ is about 70 g/L to about 130 g/L, and the concentration of HCl is about 30 ppm to about 80 ppm. The plating solution 225 may include any suitable concentration of $CuSO_4$, such as less than, equal to, or greater than about 160 g/L, 165 g/L, 170 g/L, 175 g/L, 180 g/L, 185 g/L, 190 g/L, 195 g/L, 200 g/L, 205 g/L, 210 g/L, 215 g/L, 220 g/L, 225 g/L, 230 g/L, 235 g/L, or about 240 g/L, etc. The plating solution 225 may include any suitable concentration of $H_2SO_4$, such as less than, equal to, or greater than about 70 g/L, 75 g/L, 80 g/L, 85 g/L, 90 g/L, 95 g/L, 100 g/L, 105 g/L, 110 g/L, 115 g/L, 120 g/L, 125 g/L, or about 130 g/L, etc. The plating solution 225 may include any suitable concentration of HCl, such as less than, equal to, or greater than about 30 ppm, 35 ppm, 40 ppm, 45 ppm, 50 ppm, 55 ppm, 60 ppm, 65 ppm, 70 ppm, 75 ppm, or about 80 ppm, etc.

The plating solution 225 may be free of organic additive agents including accelerators (e.g., organic sulfide compound) and suppressors (e.g., polyether compound). Other additive agents such as brighteners (e.g., sulfur-containing organic substance), levelers (e.g., nitrogen-containing compound), and/or the like, may not be added to the plating solution 225. For example, no addition of any additives to the plating solution 225, and the plating solution 225 may be viewed as the non-additives-containing solution. It is understood that a conventional electroplating bath in a plating process including various additive agents, and those additive agents may decompose and/or cause damage to the photoresist layer PR during the electroplating process, so that decomposed by-products may be formed in the plating bath. Under this scenario, the plating quality may be negatively affected, e.g., voids that degrade performance and reliability may be formed in the plated conductive layer. In some cases, voids in the plated conductive layer may be found after a batch of work pieces have been processed, such that the plating solution needs to be frequently replaced, and the production yield is hence adversely affected. The plating solution 225 used in the electroplating apparatus 200 is additive-free plating solution that is contrary to the conventional additives-containing plating solution. Since the plating solution 225 is free of additive agents, no detrimental decomposition product will be generated.

The plating solution 225 may be cleaner than the conventional plating solution having additive agents adding thereto. For example, the plating solution 225 without adding additive agents may contain less concentration of contaminants and/or by-products. For example, decomposition products (e.g., decomposed photoresist) and organic contaminants generated in the plating solution 225 may be absorbed in the carbon filter 234. Since the plating solution 225 has the lower concentration of contaminants and/or by-products, the number of carbon filter 234 used to filter the return flow of the plating solution 225 may be reduced. For example, only one carbon filter 234 is equipped to remove, among other things, particulates, contaminants and/or by-products in the return flow of the plating solution 225. It is appreciated that since the plating solution 225 is free of additive agents, no decomposed additive agent will be generated in the plating solution 225, so that one carbon filter may be used to filter the return flow of the plating solution 225. In comparison, carbon filter cannot be used to filter the conventional electroplating bath having additive agents because those decomposed additive agent causes damage to filter media in the carbon filter. In some embodiments, the plating solution 225 is circulated continuously through multiple same type of filter or different types of filters including the carbon filter 234 to improve removal efficiency. In some embodiments, the carbon filter 234 is an activated carbon filter with a filter mesh sufficiently fine to entrap contaminants. For example, the filter mesh is about 0.5 μm. Alternatively, the filter mesh is less than or greater than about 0.5 μm which depends on process requirements.

It is noted that sufficient current density is applied and plating performed for a period of time sufficient to form the plated conductive layer with a desired thickness and quality. In some embodiments, a current density of about 1 A/dm$^2$ to about 4 A/dm$^2$ is applied for about 2 minutes to about 8 minutes to form the plated conductive layer on the seed material. In some embodiments, the plating bath is kept at room temperature (e.g., about 25° C.). Although higher or lower current densities and temperature may be used. The redistribution layer formed by plating at a high current density and a short plating time may be capable of achieving excellent properties (e.g., high tensile strength, high elongation rate, etc.) in comparison to the redistribution layer formed by conventional electroplating technique. For example, the current density applied in the electroplating apparatus 200 is about 3 times greater than the applied current density of the conventional electroplating apparatus. In comparison, the plating time is about 3 times shorter than the plating time need for electroplating using the conventional electroplating apparatus.

Continue to FIG. 3 and also with reference to FIG. 1C, the plated conductive layer 1244 formed by the electroplating apparatus 200 may include the impurity (e.g., carbon (C), nitrogen (N), oxygen (O), sulfur (S), and chlorine (Cl)) due to the nature of the plating process. For example, the concentration of impurities in the plated conductive layer 1244 may be analyzed by secondary ion mass spectrometry (SIMS) for copper, C, N, O, S, and Cl. It is noted that the copper impurity concentration is measured in terms of the concentration in parts per million (ppm). When the copper RDL sample (i.e. the plated conductive layer 1244) is tested to examine the impurity concentration, it is observed that the plated conductive layer 1244 formed by the electroplating apparatus 200 has relatively low impurity concentration. In some embodiments, the concentration of S in the plated conductive layer 1244 is less than 0.1 ppm. For example, the concentration of S in the plated conductive layer 1244 ranges from about 0.01 ppm to about 0.1 ppm. In some embodiments, the concentration of Cl in the plated conductive layer 1244 is less than 1 ppm. For example, the concentration of Cl in the plated conductive layer 1244 ranges from about 0.1 ppm to about 1 ppm. The copper impurity concentration (e.g., in terms of C, N, and O) in the plated conductive layer 1244 may also be relatively low as compared to the plated copper layer formed by conventional electroplating apparatus. In some embodiments, the sum of concentrations of C, N, O, S, and Cl in the plated conductive layer 1244 is less than about 1000 ppm. In some embodiments, the sum of concentrations of C, N, O, S, and Cl in the plated conductive layer 1244 is less than about 150 ppm. For example, the sum of impurity concentration in the plated layer 1244 ranges from about 30 ppm to about 150 ppm. In comparison to the plated conductive layers formed by conventional electroplating solution, the sum of impurity concentration of the plated conductive layer 1244 is reduced by about 85% to about 97%.

It is understood that decomposed additive agents and damaged photoresist layer in a conventional plating solution may negatively affected on the plated copper layer, for example, the high concentration of impurities may be observed in void locations of the plated copper layer. It is also known that accumulation of decomposed additive agents in a conventional plating solution limits the lifetime of the plating bath and degrades the plating characteristics. By providing the plating solution 225 that is substantially additive-free and configuring the carbon filter 234 to remove contamination from the return flow of plating solution 225, ultra-low impurity concentration in the plated conductive layer 1244 may be achieved. The damage to the photoresist layer PR causing by additive agents in a conventional plating solution may be reduced or eliminated by using the non-additives-containing plating solution 225. The electroplating apparatus 200 may produce the plated conductive layer 1244 without voids or defects. The plated conductive layer 1244 may have sufficient strength and stability after reliability test. The use of the additive-free plating solution 225 may permit long lifetime for the plating bath and lead to constant plating conditions throughout the lifetime of the plating bath, and fabrication costs for the formation of redistribution layer may be reduced.

Figure 4:
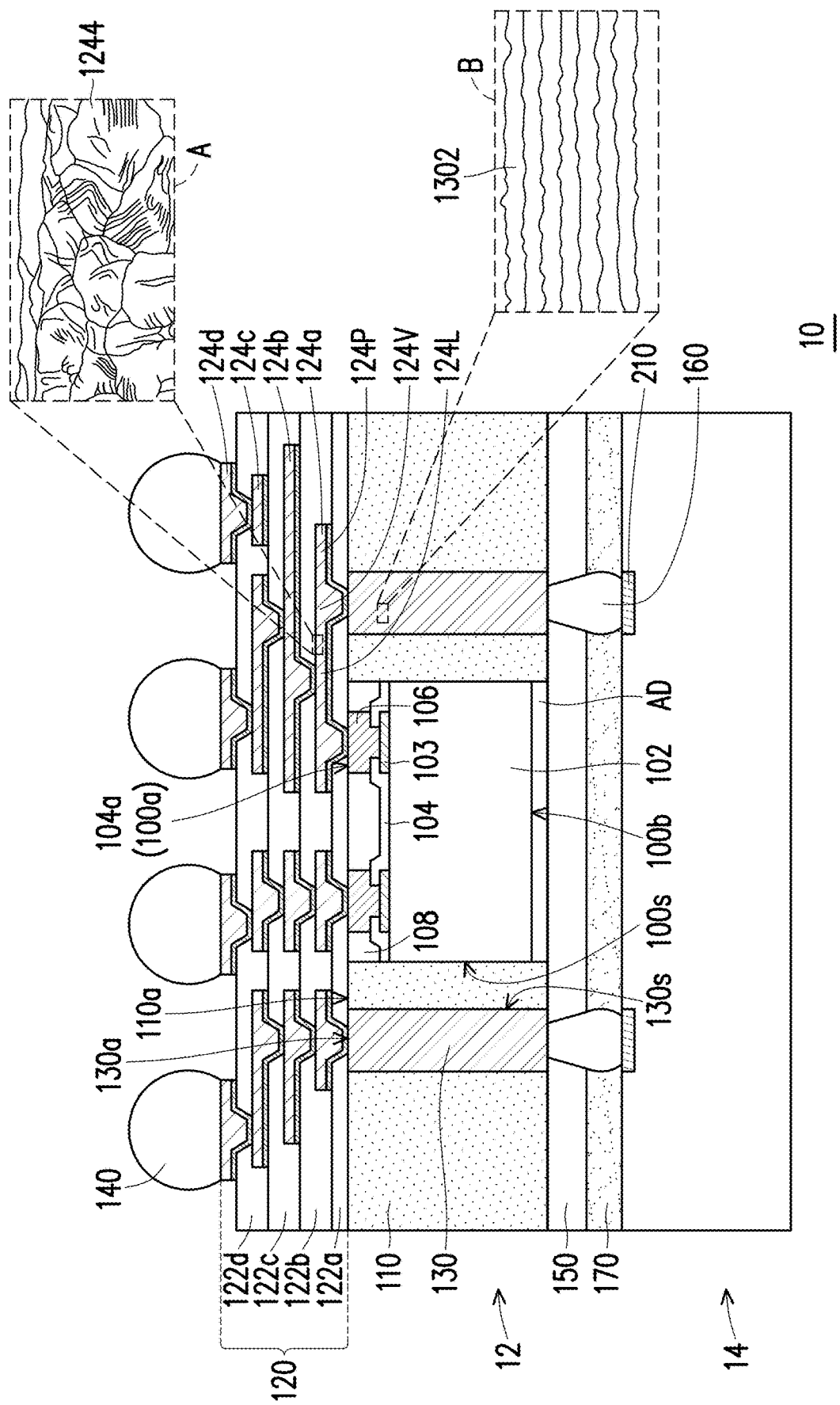
FIG. 4 is a schematic cross-sectional view of a semiconductor package including a redistribution structure formed by electroplating apparatus in accordance with some embodiments.

FIG. 4 is a schematic cross-sectional view of a semiconductor package including a redistribution structure formed by electroplating apparatus in accordance with some embodiments. Referring to FIG. 4, a semiconductor package 10 includes a first package component 12 and a second package component 14 electrically coupled to the first package component 12. For example, the first package component 12 includes a semiconductor die 100, an insulating encapsulation 110 laterally covering the semiconductor die 100, and a redistribution structure 120 disposed on the semiconductor die 100 and the insulating encapsulation 110. In some embodiments, the redistribution structure 120 includes a plurality of conductive patterns (e.g., 124a-124d) formed by the plating process described in FIG. 3.

In some embodiments, the semiconductor package 10 may be referred to as a fan-out package. The semiconductor package 10 may include a plurality of through insulating vias (TIVs) 130 disposed aside the semiconductor die 100 and penetrating through the insulating encapsulation 110 to be in physical and electrical contact with the bottommost one of the conductive patterns (e.g., 124a) of the redistribution structure 120. The semiconductor package 10 may include a plurality of external terminals 140 disposed on the topmost one of the conductive patterns (e.g., 124d) of the redistribution structure 120, and the semiconductor die 100 may be electrically coupled to the external terminals 140 through the redistribution structure 120. In some embodiments, the semiconductor package 10 includes a polymer layer 150 disposed on the insulating encapsulation 110 opposite to the redistribution structure 120, and the polymer layer 150 may have openings revealing at least a portion of the TIVs 130 for further electrical connection.

In some embodiments, the TIVs 130 is formed by: forming a seed material layer (not shown) over a dielectric layer (e.g., the polymer layer 150 or an adhesive layer (e.g., LTHC coating), etc.); forming a patterned photoresist (not shown) over the seed material layer, where each of the openings in the patterned photoresist corresponds to a location of the respective TIV 130 to be formed; filling the openings with a plated conductive layer (e.g., the plated copper layer); removing the photoresist using, e.g., an ashing or a stripping process; and removing portions of the seed material layer on which the TIVs 130 are not formed. Other steps or methods for forming the TIVs 130 are possible. In some embodiments, after forming the TIVs 130, the semiconductor die 100 is disposed to be surrounded by the TIVs 130. Alternatively, the semiconductor die 100 is placed prior to forming the TIVs 130.

Continue to FIG. 4, the semiconductor die 100 may include a plurality of contact pads 103 disposed over a semiconductor substrate 102, a passivation layer 104 may be disposed over the semiconductor substrate 102 to partially cover the contact pads 103, a plurality of conductive bumps 106 disposed on the passivation layer 104 and extending into openings of the passivation layer 104 to be in physical and electrical contact with the contact pads 103, and a protection layer 108 disposed on the passivation layer 104 to at least laterally cover the conductive bumps 106. The semiconductor substrate 102 of the semiconductor die 100 may be or may include a bulk silicon substrate or other semiconductor materials (e.g., including group III, group IV, group V elements, or the like). In some embodiments, the semiconductor substrate 102 is or includes a silicon-on-insulator substrate, a germanium-on-insulator substrate, and/or the like. The semiconductor substrate 102 may include active components (e.g., diodes, transistors or the like) and passive components (e.g., resistors, capacitors, inductors or the like) formed therein. A material of the contact pads 103 may include aluminum, but other suitable conductive materials (e.g., copper, metal alloy, etc.) may be used. In some embodiments, the material of the passivation layer 104 includes silicon oxide, silicon nitride, un-doped silicate glass, polyimide, or the like. In some embodiments, a material of the conductive bumps 106 may include copper or copper alloys, although other metals (e.g., aluminum, silver, gold, and combinations thereof, etc.) may be used. The protection layer 108 may be made of PBO, PI, BCB or suitable polymers or inorganic materials. It is appreciated that the illustration of the semiconductor die 100 is schematic and is not in scale.

The semiconductor die 100 may be or may include a logic die (e.g., central processing unit (CPU), graphics processing unit (GPU), system-on-a-chip (SoC), an application-specific integrated circuit (ASIC), microcontroller, etc.), a memory die (e.g., static random access memory (SRAM) die, dynamic random access memory (DRAM) die, etc.), baseband (BB) die, a digital die, an analog die, a power management integrated circuit (PMIC) die, a radio frequency (RF) die, a sensor die, a micro-electro-mechanical-system (MEMS) die, a signal processing die, the like, or a combination thereof. It should be appreciated that the number and the function of the semiconductor dies to be packaged may depend on the product requirements. In some embodiments, an adhesive layer AD is disposed on a back surface 100b of the semiconductor die 100 opposite to the active surface 100a where the conductive bumps 106 are distributed. The adhesive layer AD may be a die attached film (DAF), an adhesive bonding film (ABF), or the like. For example, the semiconductor die 100 is bonded to the polymer layer 150 via the adhesive layer AD.

Still referring to FIG. 4, in some embodiments, after forming the TIVs 130 and placing the semiconductor die 100, the insulating encapsulation 110 is formed to encapsulate the TIVs 130 and the semiconductor die 100. For example, the insulating encapsulation 110 extends along the sidewalls 100s of the semiconductor die 100 and the sidewalls 130s of the TIVs 130.

The insulating encapsulation 110 may be or may include a molding compound, an epoxy, an organic polymer, a polymer with or without a silica-based or glass filler added, or other insulating materials. In some embodiments, the insulating encapsulation 110 is applied using a wafer level molding process (e.g., compressive molding, transfer molding, or the like). A curing process is optionally performed to solidify the insulating encapsulation 110. In some embodiments, a planarization process (e.g., chemical and mechanical polish (CMP), mechanical grinding, etching, combination of these, or the like) is performed to level the insulating encapsulation 110, the TIVs 130, and the active surface 100a of the semiconductor die 100. For example, a surface 110a of the insulating encapsulation 110 is subrationally flush with surfaces 130a of the TIVs 130 and surfaces 104a of the conductive bumps 106.

Continue to FIG. 4, after forming the insulating encapsulation 110, the redistribution structure 120 may be formed on the surface 110a of the insulating encapsulation 110, the surfaces 130a of the TIVs 130 and the active surface 100a of the semiconductor die 100. For example, the redistribution structure includes one or more layers of conductive patterns (e.g., 124a, 124b, 124c, and 124d) formed in one or more dielectric layer (e.g., 122a, 122b, 122c, and 122d). In some embodiments, the one or more dielectric layers (e.g., 122a-122d) are formed of a polymer, such as PBO, PI, BCB, or the like; a nitride such as silicon nitride; an oxide such as silicon oxide, or the like. The one or more dielectric layers (e.g., 122a-122d) may be formed by a suitable deposition process, such as spin-coating, CVD, laminating, the like, or a combination thereof.

In some embodiments, each level of the conductive patterns (e.g., 124a-124d) of the redistribution structure 120 includes line portions 124L, pad portions 124P, and via portions 124V that are formed of a suitable conductive material such as copper, titanium, tungsten, aluminum, or the like. In some embodiments, the conductive patterns (e.g., 124a-124d) are formed by the method described in FIGS. 1A-1F, where each level of the dielectric layers (e.g., 122a-122d) is as the base layer 122 and the conductive patterns (e.g., 124a-124d) formed on each level of the dielectric layers (e.g., 122a-122d) is as the conductive pattern 124 including the seed layer 1242 and the overlying plated conductive layer 1244. In some embodiments, the via portions 124V of the bottommost level of the conductive patterns 124a are in physical and electrical contact with the surfaces 130a of the TIVs 130 and the surfaces 104a of the conductive bumps 106 that are accessibly exposed by the bottommost level of the dielectric layers 122a. For example, the semiconductor die 100 is electrically coupled to TIVs 130 through the conductive patterns (e.g., 124a-124d) of the redistribution structure 120. The conductive patterns (e.g., 124a-124d) may be referred to as redistribution circuitries (or traces).

In some embodiments, the topmost level of the conductive patterns 124d includes under bump metallization (UBM) pads for the external terminals 140 landing thereon. In some embodiment, the respective UBM pad includes multi-layers of conductive materials, such as a layer of titanium, a layer of copper, and a layer of nickel. However, there are many suitable arrangements of conductive materials and layers that are suitable for the formation of the UBM pads. It is noted that the number of dielectric layers and the number of layers of the conductive patterns in the redistribution structure 120 of FIG. 4 are merely non-limiting examples, and other numbers of the dielectric layers and other numbers of layers of the conductive patterns are possible.

Still referring to FIG. 4, in some embodiments, after forming the redistribution structure 120, the external terminals 140 are formed over the topmost level of the conductive patterns 124d (e.g., the UBM pads) of the redistribution structure 120. The external terminals 140 may be or may include solder balls (e.g., ball grid array (BGA)), metal pillars, controlled collapse chip connection (C4) bumps, micro-bumps, electroless nickel-electroless palladium-immersion gold (ENEPIG) formed bumps, combination thereof (e.g., a metal pillar having a solder ball attached thereof), etc. A reflow process may be performed after placing or forming the conductive balls/pillars on the conductive pattern 124d (e.g., UBM pads), giving the first conductive terminal 140 a shape of a partial sphere in accordance with some embodiments. Alternatively, the external terminals 140 may include non-spherical conductive connectors or may include other shapes.

Continue to FIG. 4, the polymer layer 150 may be formed or may be patterned after forming the external terminals 140. For example, the polymer layer 150 includes openings accessibly exposing at least a portion of the TIVs 130. The polymer layer 150 may be or may include PBO, PI, BCB, a nitride such as silicon nitride, an oxide such as silicon oxide, or other suitable dielectric material. The dielectric layer 110 may be formed by a suitable deposition process, such as spin coating, chemical vapor deposition (CVD), laminating, the like, or a combination thereof. In some embodiments, the polymer layer 150 is replaced with another redistribution structure that is formed by similar method to the redistribution structure 120. Under this scenario, the redistribution structure 120 is referred to as a front side redistribution structure, and the another redistribution structure located at the rear side of the semiconductor die 100 may be referred to as a back side redistribution structure.

In some embodiments, the second package component 14 is disposed over the polymer layer 150. For example, a reflow process is performed to electrically and mechanically couple the conductive pads 210 of the second package component 14 to the TIVs 130 through conductive joints 160. In some embodiments, the conductive joints 160 include solder regions, conductive pillars (e.g., copper pillars with solder regions on the copper pillars), or other suitable material(s). For example, the conductive joints 160 extend into the openings of the polymer layer 150 to be in physical and electrical contact with the TIVs 130. In some embodiments, an underfill layer 170 is optionally formed in the gap between the first package 12 and the second package component 14 to laterally cover the conductive joints 160 by dispensing, injecting, or other suitable process. A curing process may be performed to cure the underfill layer 170. The second package component 14 may be or may include one or more packaged dies (e.g., memory dies; not shown). In such embodiments, the semiconductor package 10 may be referred to as a Package-on-Package (PoP) structure. In some embodiments, the second package component 14 may be or may include an interposer, a package substrate, a printed circuit board (PCB), a printed wiring board, and/or other carrier that is capable of carrying integrated circuits.

Still referring to FIG. 4, the dashed areas A and B are schematic and enlarged cross-sectional view of the plated conductive layer 1244 of the conductive pattern 124a and the plated conductive layer 1302 of the TIV 130, respectively. In some embodiments, the TIVs 130 and the conductive patterns (e.g., 124a-124d) of the redistribution structure 120 are formed by different plating solutions/apparatus. As mentioned above, the conductive patterns (e.g., 124a-124d) of the redistribution structure 120 may be formed by the plating process using the electroplating apparatus described in FIGS. 1-3.

In some embodiments, when forming the TIVs 130, an electroplating system is used to perform the electroplating process to form the plated conductive layer 1302 on the seed layer (not illustrated). For example, a plating solution is provided in a plating bath of the electroplating system, where the plating solution includes electrolyte for deposition of a conductive layer, and various additives (e.g., accelerators, suppressors, brighteners, levelers, a combination thereof, and/or the like) may be added to the plating solution used to form the plated conductive layer 1302. A structure to be plated may be immersed in the plating solution, where the structure may include the patterned photoresist disposed on the seed layer formed over a temporary carrier. Since the plating solution for forming the plated conductive layer 1302 of the TIVs 130 includes the additive agents for various purposes and the plating solution for forming the plated conductive layer 1244 of the conductive pattern 124a is free of additive agents, the resulting structure of the plated conductive layer 1302 of the TIVs 130 and the resulting structure of the plated conductive layer 1244 of the conductive pattern 124*a* are different.

Continue to the dashed areas A and B shown in FIG. 4, a single magnification for the scanning-electron micrograph (SEM) images may be used to compare plated conductive layer 1244 of the conductive pattern 124*a* of the redistribution structure 120 and the plated conductive layer 1302 of the TIV 130 for a given thickness in accordance with some embodiments. It may be observed in the enlarged cross-sectional views that for a given thickness, the plated conductive layer 1244 of the conductive pattern 124*a* of the redistribution structure 120 exhibits relatively large grain size as compared to the plated conductive layer 1302 of the TIV 130. For example, the relatively large grain size may provide the plated conductive layer 1244 having a low number of grain boundaries for a given thickness. The plated conductive layer 1302 of the TIV 130 may have finer grain size as compared to the plated copper layer 1244. The grain boundaries of the neighboring copper crystal grains in the plated copper layer 1244 can be clearly observed, while the grain boundaries of the neighboring copper crystal grains in the plated conductive layer 1302 of the TIV 130 may not be seen, for the given magnification. As shown in the dashed area B, one feature displayed in the plated conductive layer 1302 for the given magnification may be a lamellar structure. For example, the average grain size of the plated conductive layer 1244 of the conductive pattern 124*a* is about ten times greater than the average grain size of the plated conductive layer 1302 of the TIV 130.

In some embodiments, the plated conductive layer 1302 of the TIV 130 is formed as a copper layer having higher mass density material with lower resistivity as compared to the plated conductive layer 1244 of the conductive pattern 124*a*. In other words, the mass density of the plated conductive layer 1244 of the conductive pattern 124*a* may be lower than that of the plated conductive layer 1302 of the TIV 130. The resistivity of the plated conductive layer 1244 of the conductive pattern 124*a* may be higher than that of the plated conductive layer 1302 of the TIV 130. For example, the mass density of the plated conductive layer 1244 of the conductive pattern 124*a* ranges from about 5.5 g/cm$^3$ to about 6.7 g/cm$^3$. The resistivity of the plated conductive layer 1244 of the conductive pattern 124*a* may range from about 1.8 μΩ-cm to about 2.3 μΩ-cm. The ranges of the resistivity and the mass density of the plated conductive layer 1244 are merely examples, and embodiments of the disclosure are not limited thereto. In some embodiments, the thickness of the plated conductive layer 1302 of the TIV 130 may be more uniform since additives are added to the plating solution and the plated conductive layer 1302 having a finer grain structure is obtained. As mentioned in FIG. 3, using the electroplating apparatus 200 to form the plated conductive layer 1244 of the conductive pattern 124*a*, the impurity concentration (e.g., C, N, O, S, Cl) in the plated conductive layer 1244 may be relatively low. In some embodiments, the impurity concentration in the plated conductive layer 1244 of the conductive pattern 124*a* may be much lower than the impurity concentration of the plated conductive layer 1302 of the TIV 130.

Still referring to the dashed areas A and B in FIG. 4, the surface roughness of the plated conductive layer 1244 of the redistribution structure 120 may be greater than the surface roughness of the plated conductive layer 1302 of the TIV 130. In some embodiments, the levelers added to the plating solution are used to provide a leveling effect by giving the plated conductive layer 1302 of the TIV 130 a smooth surface. In comparison, the plating solution for plating the plated conductive layer 1244 is free of levelers. The plated conductive layer 1244 of the redistribution structure 120 may have the relatively roughed surface as compared to the plated conductive layer 1302 of the TIV 130. For example, the surface roughness of the plated conductive layer 1244 ranges from about 100 nm to about 180 nm.

In some embodiments, some additives added to the plating solution for forming the plated conductive layer 1302 of the TIV 130 may inhibit the growth of copper oriented at a (111) copper lattice plane and promote the growth of copper oriented at a (220) copper lattice plane. For example, an X-ray diffraction (XRD) ratio (111/200) of the XRD intensity of the crystal plane (111) to the XRD intensity of the crystal plane (200) of the plated conductive layer 1302 of the TIV 130 is within a certain range. On the other hand, the plating solution for plating the plated conductive layer 1244 may be free of those additives for inhibiting and/or promoting the growth of copper. For example, the XRD ratio (111/200) of the plated conductive layer 1244 of the redistribution structure 120 may be greater than the XRD ratio (111/200) of the plated conductive layer 1302 of the TIV 130.

In some embodiments, the elongation percentage of the plated conductive layer 1244 of the conductive pattern 124*a* is higher than that of the plated conductive layer 1302 of the TIV 130. It is appreciated that the elongation percentage is referred to as a deformation percentage of an object fractured during reliability testing with respect to a non-tested state. The plated conductive layer 1244 having the higher elongation percentage may help to prevent short-circuits from occurring in the redistribution structure 120. For example, the elongation percentage of the plated conductive layer 1244 ranges from about 15% to about 25%. It is understood that warpage may significantly impact the electrical performance of the devices or traces formed in the semiconductor package. Note that, the conductive pattern 124*a* emphasized in FIG. 4 is for illustrative purpose, the overlying conductive patterns (e.g., 124*b*-124*d*) may be formed by the same/similar plating process and have the same/similar characteristics to the conductive pattern 124*a*. By using the electroplating apparatus described in FIG. 3 to form the redistribution layer, the cracks caused by warpage may be eliminated due to the characteristics of the conductive patterns (e.g., larger grain size, larger grain boundaries, etc.). For example, the warpage of the semiconductor package 10 is reduced by about 30% as compared to the semiconductor package having the redistribution layer with finer grain structure.

Figure 5:
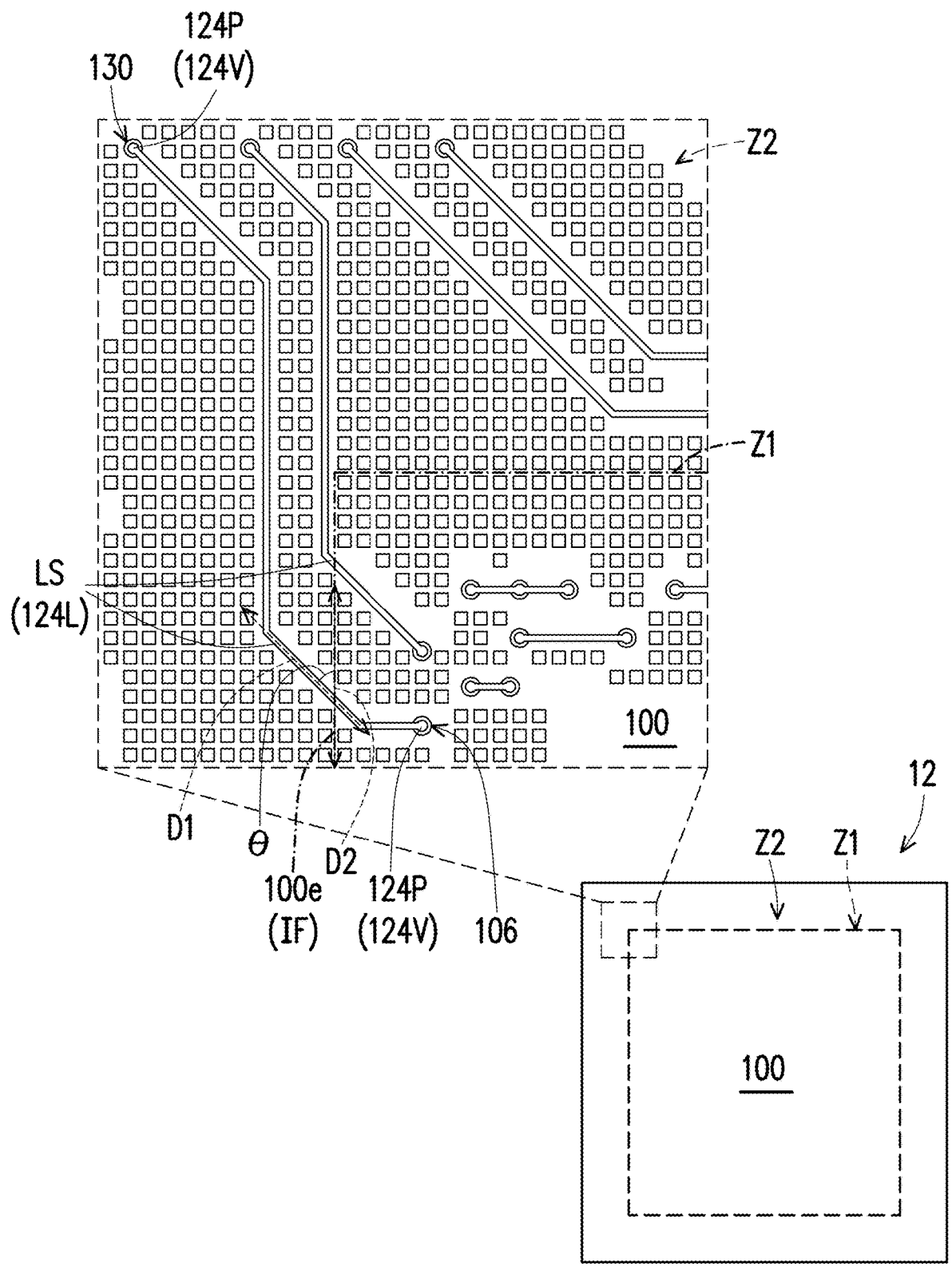
FIG. 5 is a schematic top view of a layout of redistribution layer in a semiconductor package in accordance with some embodiments.

FIG. 5 is a schematic top view of a layout of redistribution layer in a semiconductor package in accordance with some embodiments. It is noted that some elements are not shown in FIG. 5 for the purpose of simplicity and clarity. Referring to FIG. 5 and also with reference to FIG. 4, the first package component 12 of the semiconductor package 10 includes a die region Z1 and a peripheral region Z2 surrounding the die region Z1 in the top view. The semiconductor die 100 may be disposed within the die region Z1 and the TIVs 130 may be disposed within the peripheral region Z2 to surround the semiconductor die 100. The conductive pattern 124*a* of the redistribution structure 120 may be connected to the conductive bumps 106 of the semiconductor die 100 in the die region Z1 and the TIVs 130 in the peripheral region Z2 in order to create an electrical connection. For example, the conductive pattern 124*a* of the redistribution structure 120 reroutes a layout for I/O connectors of the semiconductor die 100 and may extend from the die region Z1 to the peripheral region Z2, so that the I/O connections of the semiconductor die 100 may be redistributed to a greater area than the die region Z1. In some embodiments, the peripheral region Z2 is referred to as a fan-out region, and the die region Z1 is referred to as a fan-in region. In some embodiments, other patterns disposed aside the conductive pattern 124a are dummy patterns and may be disposed for reducing loading effect or for heat-dissipating purposes.

In some embodiments, segments LS of the line portions 124L of the conductive pattern (e.g., 124a) are disposed over the edges 100e of the semiconductor die 100 (or the interface IF between the semiconductor die 100 and the insulating encapsulation 110). For example, as shown in the top-down view of FIG. 5, the extending direction D1 (e.g., lengthwise) of the segment LS and the extending direction D2 (e.g., lengthwise) of the underlying edge 100e of the semiconductor die 100 form an angle θ in the top view. The angle θ may be acute angle or obtuse angle. Alternatively, the extending direction D1 is perpendicular to the extending direction D2. In some embodiments, the line portions 124L have the segment LS oriented at a substantially 45 degree angle with respect to the edge 100e of the semiconductor die 100 in the top view. In some embodiments, the segment LS may be at the angle θ greater or less than 45 degrees with respect to the corresponding edge 100e of the semiconductor die 100. For example, the angle θ between the extending direction D1 of the segment LS and the extending direction D2 of the underlying edge 100e of the semiconductor die 100 may be greater than 0° and less than 180° in the top view. It is noted that the layout of the conductive pattern 124a shown herein is merely an example, and other arrangement/layout may be used. The layout designs for the overlying conductive patterns in the redistribution structure 120 may be similar to the layout of the conductive pattern 124a, but the disclosure is not limited to any specific layout.

It is appreciated that in the semiconductor package, heat causes both the semiconductor die and the insulating encapsulation to expand at their respective coefficients of thermal expansion (CTE) during operation, and the tensile stress resulting from the CTE mismatch may negatively affect the conductive patterns of the redistribution structure in the semiconductor package, specially, shear stress is most severe at the regions corresponding to the corners of the semiconductor die because of the mismatched thermal shrinking and expansion. For example, the conductive patterns may tend to crack so that a circuit failure results. Since the conductive patterns (e.g., 124a-124d) of the redistribution structure 120 formed using the plating process described in FIG. 3 have the characteristics (e.g., larger grain size, larger grain boundaries, higher elongation percentage, etc.), the tolerance capability of the conductive patterns (e.g., 124a-124d) to the stress resulting from the CTE mismatch may be improved. The electrical performance and reliability of the semiconductor package 10 may be enhanced. Owing to the high mechanical strength of the conductive patterns (e.g., 124a-124d), the line portions 124L of the conductive patterns (e.g., 124a-124d) may extend along any desired direction between the die region Z1 and the peripheral region Z2. The extending direction D1 of the line portions 124L of the conductive patterns (e.g., 124a-124d) may not be limited to any particular orientation, thereby improving flexibility of the layout design of the redistribution structure 120. This flexibility saves cost and allows any changes of the redistribution structure. It is noted that the semiconductor package 10 presented herein is not intended to be limited to the details recited above, and the redistribution layer formed by the electroplating apparatus disclosed herein may be used in a wide variety of applications.

According to some embodiments, a redistribution structure for coupling an encapsulated die is provided, the redistribution structure includes a conductive pattern disposed over and electrically coupled to the encapsulated die. The conductive pattern extends beyond an edge of the encapsulated die along a first extending direction which intersects a second extending direction of the edge of the encapsulated die by an angle in a top view, and an impurity concentration of sulfur in the conductive pattern is less than about 0.1 ppm.

According to some alternative embodiments, a semiconductor package includes a semiconductor die encapsulated by an insulating encapsulation, a through insulating via disposed aside the semiconductor die and penetrating through the insulating encapsulation, and a redistribution circuitry coupling the semiconductor die to the through insulating via. The redistribution circuitry includes an average grain size greater than an average grain size of the through insulating via for a given thickness.

According to some alternative embodiments, a electroplating method for forming a redistribution circuitry includes at least the following steps. A work piece is immersed into a plating solution in a plating tank, where the plating solution is free of organic additive agents. An electrochemical reaction is performed on the plating solution to form a redistribution circuitry on the work piece. The plating solution is filtered via a carbon filter before returning to the plating tank.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A redistribution structure for coupling an encapsulated die, the redistribution structure comprising:
 a conductive pattern disposed over and electrically coupled to the encapsulated die, wherein the conductive pattern extends beyond an edge of the encapsulated die along a first extending direction which intersects a second extending direction of the edge of the encapsulated die by an angle in a top view, an impurity concentration of sulfur in the conductive pattern is less than about 0.1 ppm, and an impurity concentration of chlorine in the conductive pattern is less than about 1 ppm.

2. The redistribution structure of claim 1, wherein the impurity concentration of sulfur in the conductive pattern ranges from about 0.01 ppm to less than about 0.1 ppm.

3. The redistribution structure of claim 1, wherein the angle between the first extending direction of the conductive pattern and the second extending direction of the edge of the encapsulated die is an acute angle in the top view.

4. The redistribution structure of claim 1, wherein the conductive pattern comprises a plated conductive layer overlying a seed layer, the plated conductive layer comprises a plurality of crystal grains with an average grain size larger than 0.5 µm.

5. The redistribution structure of claim 1, wherein a surface roughness of the conductive pattern ranges from about 100 nm to about 180 nm.

6. The redistribution structure of claim 1, wherein the sum of impurity concentration in the conductive pattern is less than about 150 ppm.

7. A semiconductor package, comprising:
a semiconductor die encapsulated by an insulating encapsulation;
a through insulating via disposed aside the semiconductor die and penetrating through the insulating encapsulation; and
a redistribution circuitry coupling the semiconductor die to the through insulating via, the redistribution circuitry comprising an average grain size greater than an average grain size of the through insulating via for a given thickness.

8. The semiconductor package of claim 7, wherein an impurity concentration of a plated conductive layer of the redistribution circuitry is less than that of a plated conductive layer of the through insulating via.

9. The semiconductor package of claim 8, wherein an impurity concentration of sulfur in the plated conductive layer of the redistribution circuitry is less than about 0.1 ppm.

10. The semiconductor package of claim 8, wherein an impurity concentration of chlorine in the plated conductive layer of the redistribution circuitry is less than about 1 ppm.

11. The semiconductor package of claim 7, wherein the redistribution circuitry extends over the semiconductor die along a first extending direction and beyond an interface of the semiconductor die and the insulating encapsulation to be disposed over the insulating encapsulation, and the first extending direction of the redistribution circuitry is tilted with respect to a second extending direction of the interface by an angle in a top view.

12. The semiconductor package of claim 7, wherein the angle between the first extending direction of the redistribution circuitry and the second extending direction of the interface is an acute angle.

13. The semiconductor package of claim 7, wherein a mass density of a plated conductive layer of the redistribution circuitry is lower than that of a plated conductive layer of the through insulating via.

14. The semiconductor package of claim 13, wherein the mass density of the plated conductive layer of the redistribution circuitry ranges from about 5.5 g/cm$^3$ to about 6.7 g/cm$^3$.

* * * * *